United States Patent

Congdon et al.

[11] Patent Number: 6,064,783
[45] Date of Patent: May 16, 2000

[54] INTEGRATED LASER AND COUPLED WAVEGUIDE

[76] Inventors: Philip A. Congdon, 1705 Yorkshire Dr., Richardson, Collin County, Tex. 75082; Lily Y. Pang, 2722 Northview Dr., McKinney, Collin County, Tex. 75070; Gary A. Evans, 4520 Savino Dr., Plano, Collin County, Tex. 75093

[21] Appl. No.: 08/248,937

[22] Filed: May 25, 1994

[51] Int. Cl.[7] .................................................. G02B 6/26
[52] U.S. Cl. ........................... 385/15; 385/14; 385/37; 385/50; 385/88; 372/50
[58] Field of Search ................... 385/50, 37, 15, 385/14, 10, 49, 31, 88; 372/46–50, 96

[56] References Cited

U.S. PATENT DOCUMENTS

| | | | |
|---|---|---|---|
| 4,097,118 | 6/1978 | Hammer | 385/50 |
| 4,318,058 | 3/1982 | Mito et al. | 372/50 |
| 4,737,007 | 4/1988 | Alferness et al. | 385/37 |
| 5,070,488 | 12/1991 | Fukushima et al. | 385/14 |
| 5,123,070 | 6/1992 | Bradley | 385/37 |
| 5,220,573 | 6/1993 | Sakata et al. | 372/96 |

FOREIGN PATENT DOCUMENTS

| | | | |
|---|---|---|---|
| 403263010A | 11/1991 | Japan | 385/37 |
| 4-287389 | 10/1992 | Japan | 372/50 |
| 1535171 | 12/1978 | United Kingdom | 385/37 |

OTHER PUBLICATIONS

Aiki, et al., "A Frequency–Multiplexing Light Source with Monolithically Integrated Distributed Feedback Diode Lasers", *IEEE Journal of Quantum Electronics*, vol. QE–13, No. 4, Apr. 1977, pp. 220–223.

*Primary Examiner*—Hemang Sanghavi
*Attorney, Agent, or Firm*—Carlton H. Hoel; David Denker; Richard L. Donaldson

[57] ABSTRACT

A grating (461) coupling the output of a semiconductor laser (410) in a semiconductor waveguide to a dielectric waveguide (451) having a core (458) which may be efficiently butt-coupled to the core of an optical fiber (470); the laser and semiconductor waveguide, coupling grating, and dielectric waveguide are integrated on a single substrate. Further, multiple lasers (410, 420, 430, 440) with differing lasing frequencies may be integrated and their outputs grating coupled into a single dielectric waveguide (450) for wavelength division multiplexing.

15 Claims, 7 Drawing Sheets

INTEGRATED LASER AND COUPLED WAVEGUIDE

BACKGROUND OF THE INVENTION

The invention relates to optoelectronic semiconductor devices, circuits, and waveguides, and, more particularly, to semiconductor lasers integrated with dielectric waveguides and methods of fabrication.

Optical communication systems typically employ semiconductor laser sources and glass optical fiber communication channels. Semiconductor lasers in the form of heterojunction diodes with quantum well active regions and made of materials such as $Al_xGa_{1-x}As$ with GaAs quantum wells provide a compact and rugged source of infrared light which can be easily modulated by simply varying the diode current. In particular, a stripe geometry diode laser may be as small as 10 μm wide by 100 μm long by 30 nm thick active area imbedded in a 400 nm thick cavity. The reflecting ends of the cavity may be distributed Bragg reflectors to avoid cleaved mirror ends. For example, Tiberio et al., Facetless Bragg reflector surface-emitting AlGaAs/GaAs laers fabricated by electron-beam lithography and chemically assited ion-beam etching, 9 J.Vac.Sci.Tech.B 2842 (1991), discloses 250 μm wide diodes of $Al_xGa_{1-x}As$ with GaAs quantum wells and distributed Bragg reflector ends made of free standing (on the same semiconductor substrate as the diode) AlGaAs fingers spaced with a period of 120 nm. Further, Tiberio et al. formed a grating in the AlGaAs with period 307 nm adjacent to the distributed Bragg reflector; the grating launched the laser output into space at a 45 angle to the surface of the substrate containing the laser with distributed Bragg reflector. See FIG. 1 which shows the Tiberio et al. setup in cross sectional elevation view.

Tennant et al., Multiwavelength distributed Bragg reflector laser array fabricated using near field holographic printing with an electron-beam generated phase grating mask, 11 J.Vac.Sci.Tech.B 2509 (1993), describe the use of holographic lithography for patterning distributed Bragg reflectors in an array of seimconductor lasers for use with wavelength division multiplexing.

The output of a stripe heterojunction diode semiconductor laser, typically operated in the lowest order TE mode, has a highly asymmetric near field pattern (see end on view of FIG. 2a) and a wide vertical spread angle (numerical aperture ~0.35, see elevation view of FIG. 2b) but a small horizontal spread (numerical aperture ~0.1) due to the typically large difference in index of refraction between the active core and the cladding and the small height to width ratio of the cavity. In contrast, communication channel optical fibers which would carry the output of the semiconductor laser has a circular core (see end on view of FIG. 2c) and a small spread angle due to the small difference between the index of refraction of the core and the cladding (see elevation view of FIG. 2d); that is, the numerical aperture is symmetric and small (~0.15). Thus the direct coupling of the semiconductor laser output into an optical fiber has low efficiency due to mode field mismatching, and the usual approach to this problem inserts a lens between the laser and the optical fiber or to form the fiber end into a lens. FIG. 3a shows such a lens insertion to provide a high efficiency coupling, and FIG. 3b shows an optical fiber with its end rounded into a lens. Brenner et al, Integrated Optical Modeshape Adapters in InGaAsP/InP for Efficient Fiber-to-Waveguide Coupling, 5 IEEE Phot.Tech.Lett. 1053 (1993), describe a semiconductor waveguide with vertically tapered core and thickened cladding at a waveguide end for better coupling to a lensed optical fiber.

However, such inserted lens or lensed optical fiber end systems increase costs of fabrication and assembly and decrease ruggedness of the final system.

Further, wavelength division multiplexing requires combining outputs of discrete lasers using an optical fiber multiplexer which is bulky and costly.

SUMMARY OF THE INVENTION

The present invention provides a semiconductor laser integrated with a silicon dioxide based waveguide having high efficiency coupling of the laser output into the waveguide by a integrated grating and a method of fabrication. This permits the laser output to be simply coupled into an optical fiber by a simple butt coupling of the optical fiber to the waveguide. Further, multiple lasers with different wavelengths can be integrated and their outputs coupled and combined into a single waveguide for wavelength division multiplexed operation.

The present invention provides technical advantages including simple laser to optical fiber coupling, integrated circuit ruggedness of the laser plus waveguide, and simple compact wavelength division multiplex source structures.

BRIEF DESCRIPTION OF THE DRAWINGS

The drawings are schematic for clarity.

DESCRIPTION OF THE PREFERRED EMBODIMENTS

Overview

Figure 1:
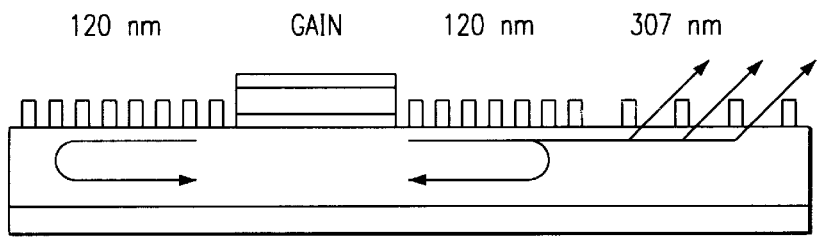
FIG. 1 shows in cross-sectional elevation view a known heterojunction diode semiconductor laser with distributed Bragg reflectors and wave launching grating.
Figure 2A:
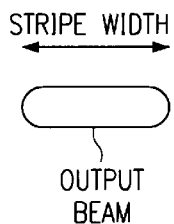
FIGS. 2a–d contrast output beam characteristics for semiconductor lasers and optical fibers.
Figure 2B:
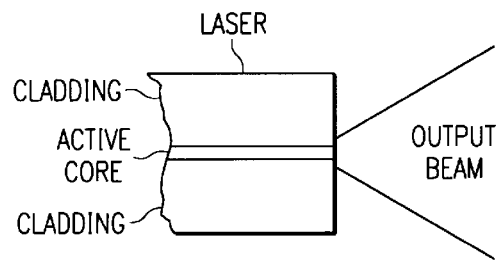
Figure 2C:
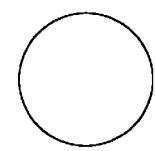
Figure 2D:
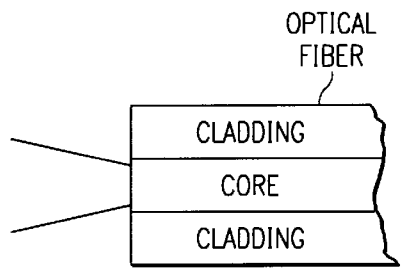
Figure 3A:
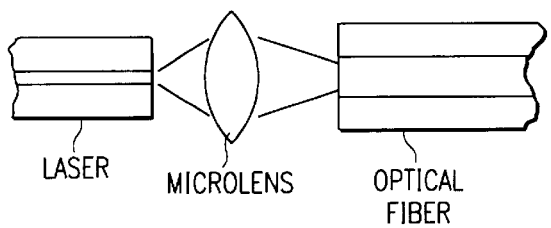
FIGS. 3a–b illustrate known lens systems for coupling semiconductor laser output into an optical fiber.
Figure 3B:
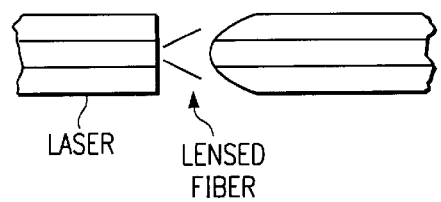
Figure 4A:
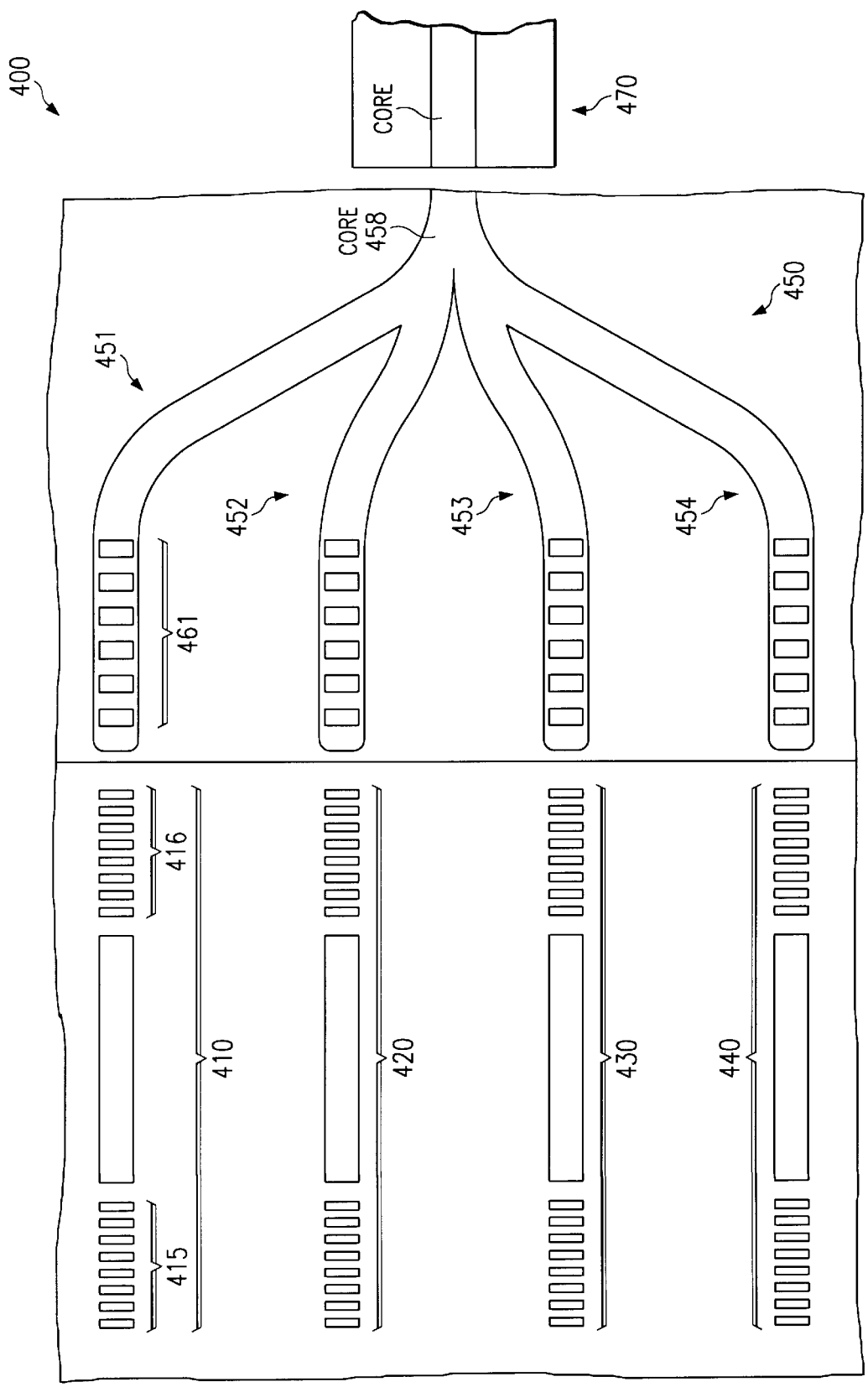
FIGS. 4a–b are plan and cross sectional elevation views of a first preferred embodiment semiconductor laser and integrated dielectric waveguide.
Figure 4B:
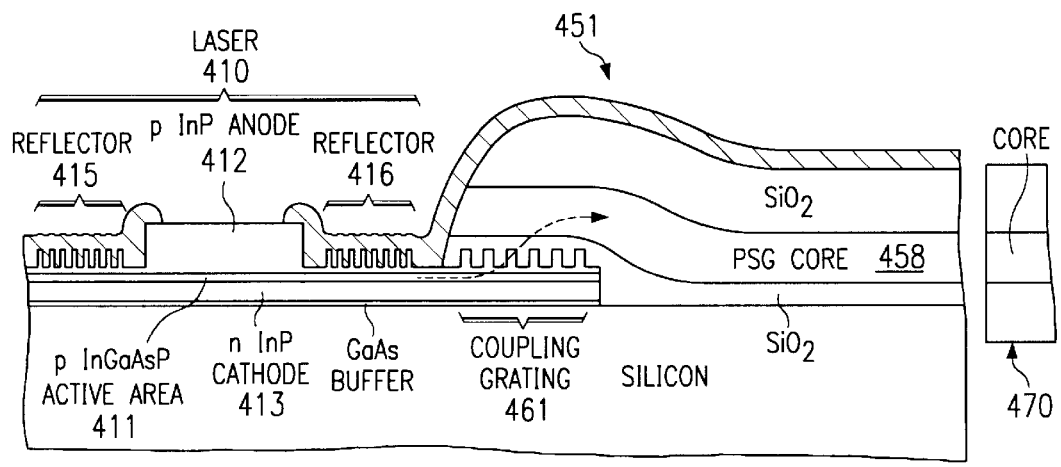

FIGS. 4a–b show in simplified cross sectional elevation and plan views a first preferred embodiment structure, generally indicated by reference numeral 400, including semiconductor lasers 410, 420, 430, and 440 with outputs coupled to integrated phosphorus doped silicon dioxide (PSG) core waveguide 450 which has branches 451, 452, 453, and 454 of core 458 with each branch coupled to the output of one laser. Each laser has the structure of a heterojunction stripe diode with distributed Bragg reflectors at each end of the active layer; additionally, each laser also has a grating adjacent to the distributed Bragg reflector at one end for enhancing the vertical coupling of the laser output into the overlying branch of waveguide 450. Also, an end portion of optical fiber 470 is shown butt-coupled to waveguide 450 with the core of optical fiber 470 aligned with the waveguide core 458. Thus the preferred embodiment avoids the lens systems of FIGS. 3a–b.

In particular, FIG. 4b shows a section through laser 410 and waveguide branch 451 and illustrates p type InGaAsP active area (which includes a four period multiple quantum well for carrier confinement and high efficiency) with p type InP anode 412 and n type InP cathode 413 on either side of the active area. Electrical current flowing through the diode causes electron-hole recombination in the active area (holes from anode 412 and electrons from cathode 413) which releases energy as photons. Outside of the active area the InGaAsP layer forms the core of a semiconductor waveguide with the InP as the cladding. The semiconductor waveguide confines generated photons due to the index of refraction of the InGaAsP core being much greater than that of the InP cladding.

Distributed Bragg reflectors 415 and 416 are formed as fingers (extending in the direction perpendicular to the plane of FIG. 4*b*) from the p type InP cladding. The period of these reflectors determines the lasing wavelength because reflection occurs when the period is a wavelength. FIGS. 4*a–b* show only a few fingers in each reflector for simplicity; each reflector typically has on the order of 1140 fingers.

Grating 461 is adjacent reflector 416 and also has fingers formed in p+ type InP cladding and parallel to the fingers of reflectors 415–416. Take the period of grating 461 to provide highly efficient coupling of the laser output in the InGaAsP core waveguide into phosphorus doped silicon dioxide glass (PSG) core waveguide 450. The broken arrow in FIG. 4*b* suggests the coupling. For example, the longitudinal propagation constant (wave vector) in the InGaAsP core equals $2\pi f n_I/c$ where f is the output light frequency, $n_I$ is the effective index of refraction of the InGaAsP core at frequency f, and c is the speed of light in vacuum. Similarly, the propagation constant in PSG core 458 is $2\pi f n_P/c$ with $n_P$ the effective index of refraction of the PSG core. With the period of coupling grating 461 equal to p, the mechanical wave vector of the grating is $2\pi/p$. Now when the mechanical wave vector of grating 461 equals the difference between the propagation vectors in the InGaAsP and PSG waveguides, the grating effects a highly efficient coupling of the two waveguides for waves of frequency f. That is, in terms of the free space wavelength, $\lambda$, take the period p as:

$$1/p = n_I/\lambda - n_P/\lambda$$

The coupling grating then provides the phase shift for high coupling efficiency. For the first preferred embodiment, the period of grating 461 equals about 700 nm for infrared frequencies. Full coupling bewteen the semiconductor waveguide and the PSG waveguide occurs with a grating length of about 500 μm.

Each of lasers 410, 420, 430, and 440 has a different frequency for lasing with the frequencies determined by the periods of the associated distributed Bragg reflectors. As seen in FIG. 4*a*, each waveguide branch, 451–454, feeds its associated laser's output into waveguide 450. This comprises wavelength division multiplexing.

Laser

Figure 5A:
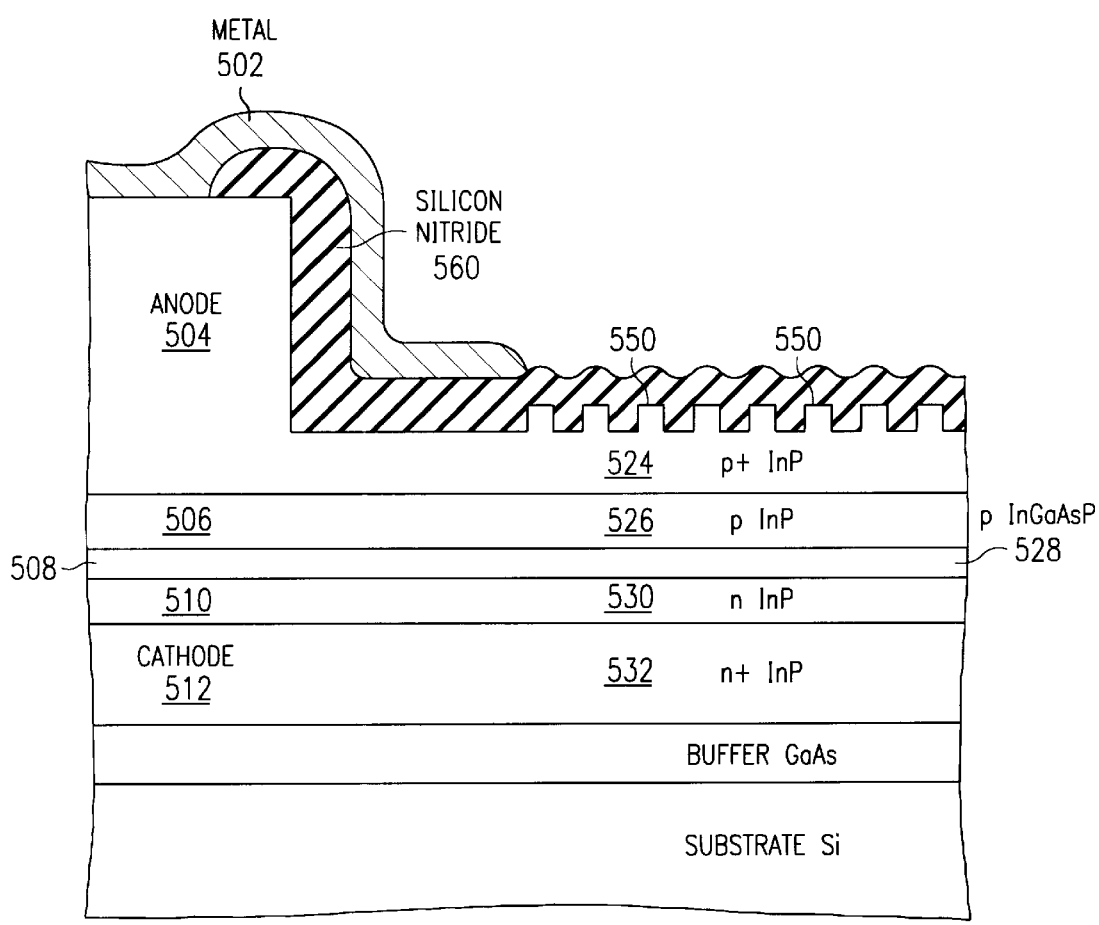
FIGS. 5a–b illustrate portions of FIG. 4b in greater detail.
Figure 6:
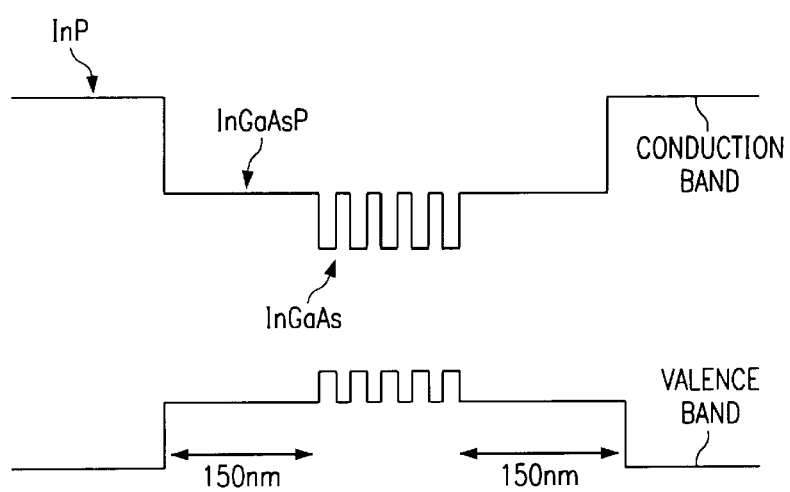
FIG. 6 is a band diagram.
Figure 7A:
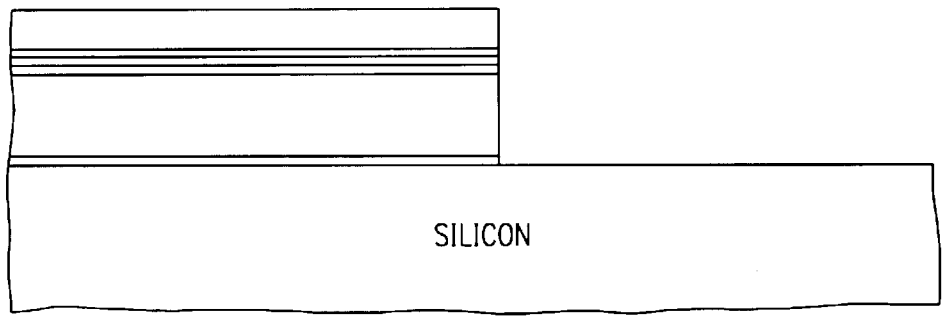
FIGS. 7a–f show steps in a preferred embodiment process of fabrication.
Figure 7B:
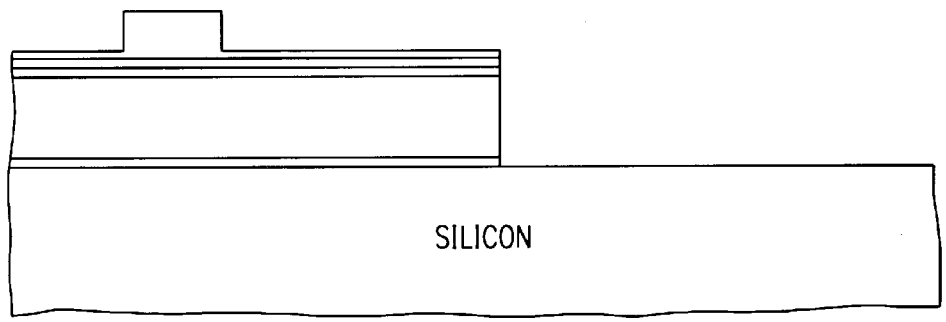
Figure 7C:
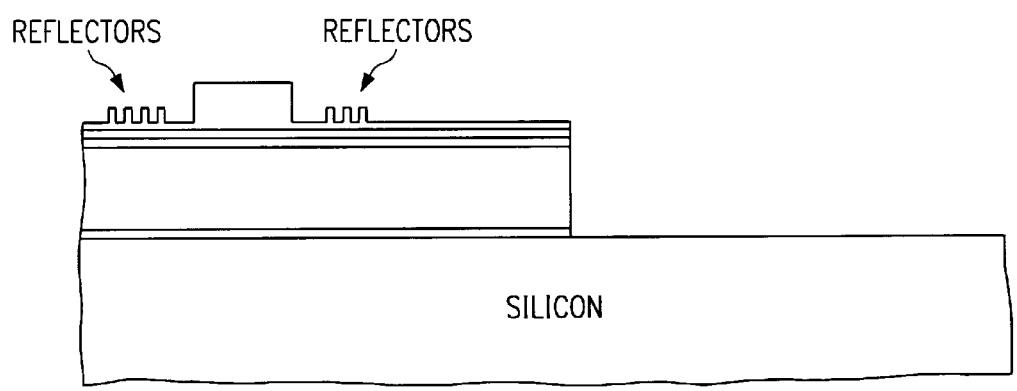
Figure 7D:
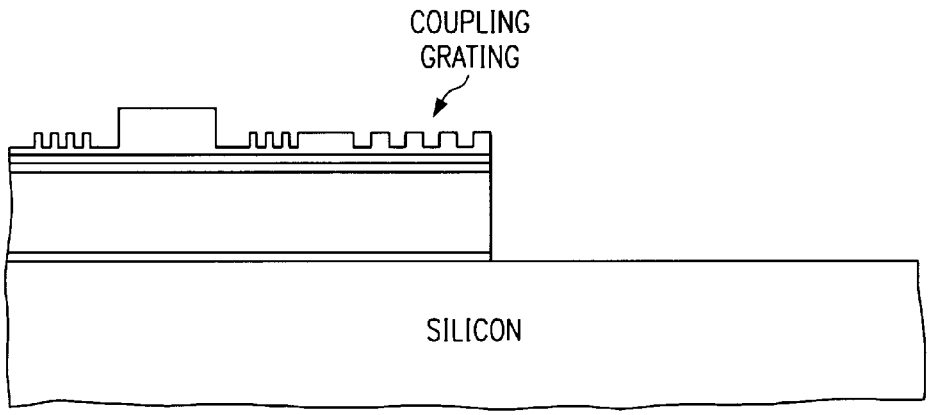
Figure 7E:
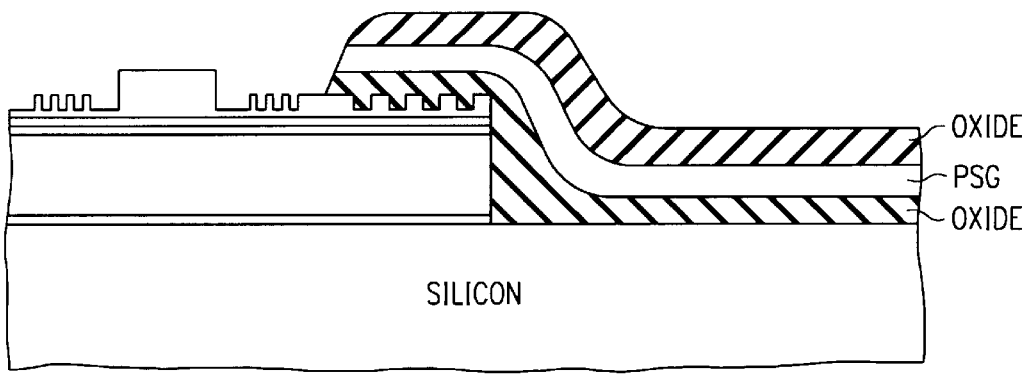
Figure 7F:
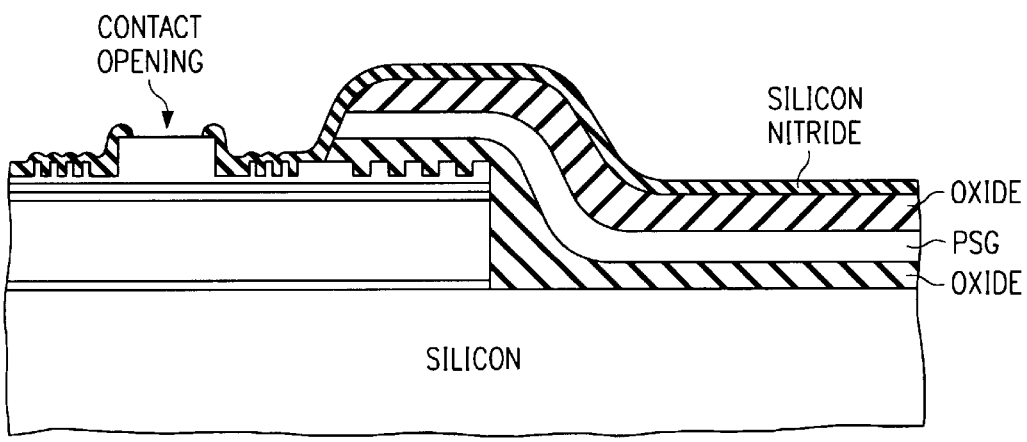

FIG. 5*a* is an enlarged view of a portion of FIG. 4*b* about the edge of anode 412 and shows metal anode contact 502, p+ InP anode 504, p InP anode 506, p InGaAsP active area 508, n InP cathode 510, n+ InP cathode 512, p InGaAsP waveguide core 528 with InP cladding by p+ InP 524, p InP 526, n InP 530, and n+ InP 532. The p InGaAsP layer forming active area 508 and semiconductor waveguide core 528 is a strained layer material system with quantum wells of InGaAs imbedded in InGaAsP barriers and sandwiched by 150 nm thick InGaAsP confinement layers. FIG. 6 shows a band diagram with the conduction and valence band edges. The bandgap of the InGaAs quantum wells is about 0.8 eV, so electron-hole recombination can release infrared light with free space wavelength about the common communication wavelength of 1.55 μm. Varying the quantum well thickness (between 2 and 12 nm) will move the quantized levels and thereby permit adjustment of the recombination energy. The bandgap of the adjoining InGaAsP is about 1.08 eV (corresponding to a free space wavelength of 1.15 μm) and the bandgap of the cladding InP is about 1.35 eV. The index of refraction of the InGaAsP (3.53) is higher than the index of refraction of the InP cladding (3.16), so the InGaAsP forms the core of a semiconductor waveguide. But the thickness of this core is comprable to or less than the wavelength of the generated light, so only a fraction (about 5%) of the light energy is confined to the InGaAsP core and the light energy extends well into the InP cladding.

The fingers 550 formed in p+ InP 524 together with overlying silicon nitride 560 form a distributed Bragg reflector. The reflector acts on the light enerby in the semiconductor waveguide and sets the lasing frequency as the frequency for total reflection. The frequency for total reflection simply is frequency at which the reflector fingers 550 have a period equal to a wavelength. The distributed Bragg reflectors have about 1140 fingers with a period of about 440 nm for light with a 1.55 μm free space wavelength.

Each of the lasers 410, 420, 430, and 440 has the following dimensions: stripe width 5 μm (this also is roughly the diameter of the waveguide core 458 and the diameter of the core of butt-coupled optical fiber 470), length 500 μm, active area 508 and core 528 thickness about 0.4 μm, p InP anode 506 and cladding 526 thickness 1.75 μm, p+ InP cladding 524 thickness 1.5 μm with distributed Bragg reflector fingers 550 of height 0.05 μm, n InP cathode 510 and cladding 530 thickness 0.75 μm, and n+ InP cathode 512 and cladding 532 thickness 2 μm. The separation between adjacent lasers is about 250 μm, so there no crosstalk despite the continuity of the cladding and core layers between the lasers.

As described above, the p InGaAsP layer forms both the laser active area 505 and waveguide core 528. Thus, the most preferred embodiment laser's 5 μm stripe width and 0.4 μm core thickness define a semiconductor waveguide with a height to width ratio of $$\frac{.4 \,\mu m}{5 \,\mu m} = 1 \text{ to } 12.5 \cong 1 \text{ to } 10.$$

Another preferred stripe diode laser has a 10 μm stripe width and 30 nm core thickness which gives a height to width ratio of $$\frac{30 \,nm}{10 \,\mu m} \cong 1 \text{ to } 300.$$

Alternative material systems may be used for the strained-layer quantum-well laser. Currently, there are five strained material systems (both compressive and tensile strain) for various wavelength lasers: (1) $In_XGa_{1-X}As/InAs_YP_{1-Y}$, (2) $In_XGa_{1-X}As_YP_{1-Y}/InP$, and (3) $Al_XGa_YIn_{1-X-Y}As/InP$ for telecommunications (typically infrared from 0.9 to 1.55 μm free space wavelengths), (4) AlGa(In)As(P)/GaAs for near infrared, and (5) AlGaInP/GaAs for visible light. To enhance laser performance, reshape the material's band structure to have a higher symmetry by growing the active layer material lattice-mismatched to the substrate. The $In_XGa_{1-X}As/InAs_YP_{1-Y}$ bandgap and strain are directly correlated, both compressive and tensile strain. The $In_XGa_{1-X}As_YP_{1-Y}/InP$ bandgap and strain can be adjusted independently (tensile strain only). The quantum well thickness is chosen to emit the desired wavelength light. For 1.55 μm, quantum well thickness varies from 3 to 10 nm depending upon whether the material is compressive strained to tensile strained and the amount of the strain.

Waveguide coupler

Figure 5B:
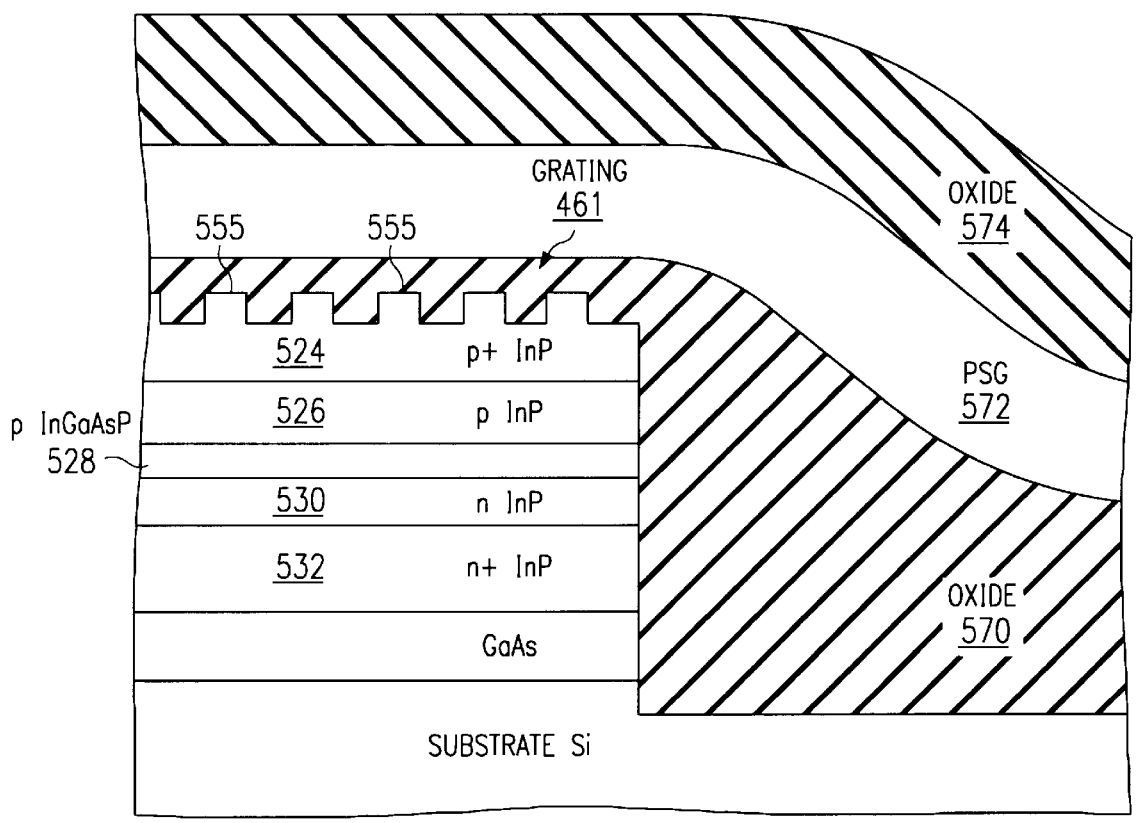

FIG. 5b is an enlarged view of a portion of FIG. 4b about the end of coupling grating 461 and shows p InGaAsP waveguide core 528, p InP cladding 526, p+ InP cladding 524, n InP cladding 530, n+ InP cladding 532 (all of these layers are extensions of the layers with same reference numerals as FIG. 5a), and grating fingers 555 of height 0.5 μm formed in p+ InP 524 with overlying silicon dioxide ("oxide") 570, PSG 572, and oxide 574. Coupling grating 461 has a total length of about 300 μm with a period of about 700 nm; thus coupling grating 461 has about 400 fingers. PSG 572 forms the core of a waveguide with oxide cladding 570 and 574. PSG core 572 has a diameter of about 5 μm and a roughly square cross sectional shape, and overlying oxide 574 has a thickness of about 6 μm. The thickness of oxide 570 directly between fingers 555 and PSG core 572 is about 0.3 μm, but this can be varied to optimize the coupling between the semiconductor waveguide with InGaAsP core 528 and the dielectric waveguide with PSG core 572.

Unlike conventional directional couplers, the logitudinal propagation constants in the semicondcutor waveguide and the dielectric waveguide greatly differ. Indeed, for a 1.55 μm free space wavelength, the effective index of refraction of the semiconductor waveguide is about 3.545 and the effective index of refraction of the dielectric waveguide is about 1.4558. Thus coupling due to the interacion of closely spaced evanescent fields is negligible. However, coupling grating 461 has a period of about 0.7 μm (700 nm) and thus a mechanical wave vector K (=2π/period) which, for light with a free space wavelength of 1.55 μm, equals the difference between the longitudinal propagation constant of the semiconductor waveguide and the longitudinal propagation constant of the dielectric waveguide. That is, after dividing by 2π:

$$1/0.7 \approx 3.545/1.55 - 1.4558/1.55$$

This implies coupling grating 461 provides the required phase matching between the semiconductor waveguide and the dielectric waveguide for high efficiency coupling.

With different frequencies of operation in the lasers or differing dielectric waveguide materials, the periodicity of coupling grating 461 would be determined in the same manner.

Fabrication

FIGS. 7a–h show in cross sectional elevation view steps of a preferred embodiment method of fabrication.

(1) Begin with a silicon substrate and grow a GaAs buffer layer, then grow the epitaxial layers as listed in following Table I; note that InGaAsP denotes $In_XGa_{1-X}As_YP_{1-Y}$ for the barrier and spacer layers and InGaAs denotes $In_XGa_{1-X}As$ for the quantum well layers. The GaAs buffer layer is grown at low temperature and provides compensation for the lattice mismatch between silicon and the other layers.

TABLE I

| Layer | Material | Thickness |
|---|---|---|
| Cladding | p+ Inp | 5 μm |
| Cladding | p InP | 1.75 μm |
| Spacer | p InGaAsP | 150 nm |
| Quantum well | p InGaAs | 8 nm |
| Barrier | p InGaAsP | 10 nm |

TABLE I-continued

| Layer | Material | Thickness |
|---|---|---|
| Quantum well | p InGaAs | 8 nm |
| Barrier | p InGaAsP | 10 nm |
| Quantum well | p InGaAs | 8 nm |
| Barrier | p InGaAsP | 10 nm |
| Quantum well | p InGaAs | 8 nm |
| Barrier | p InGaAsP | 10 nm |
| Quantum well | p InGaAs | 8 nm |
| Spacer | p InGaAsP | 150 nm |
| Cladding | n Inp | 0.75 μm |
| Cladding | n+ InP | 2 μm |
| Buffer | GaAs | 15 μm |
| Substrate | Si | 500 μm |

(2) Photolithographically define the locations of the four lasers plus coupling gratings, and etch away the grown layers outside of these locations. See FIG. 7a for a cross sectional elevation view.

(3) Photolithographically define the locations of the four laser anodes (rectangles about 5 μm by 300 μm) and etch the p+ InP to a thickness of about 2 μm; this leaves four parallel ridges, each about 3 μm high with 5 μm by 300 μm bases. See FIG. 7b.

(4) Use holographic lithography to define the fingers for the distributed Bragg reflectors on either end of the ridges formed in step (c). Note that each laser will have a different period in its reflector because four different wavelengths are being multiplexed, so use four separate lithography steps. However, the wavelengths of the four lasers will all be close to a free space wavelength of 1.55 μm. In each holographic lithography step the areas away from the reflectors being defined are masked off and a thin layer of photoresist is appied and two laser sources are used to create the interference pattern for the exposure of the photoresist. Then the p+ InP layer is etch with the holographically patterned photoresist as mask to form the fingers of the reflectors. See FIG. 7c.

(5) Repeat the holographic lithography to define the fingers for the coupling gratings. Because the wavelengths of all four lasers are roughly equal, the same coupling grating can be used for all four lasers and thus use only one holographic lithography step. Again, after the interference pattern exposes photoresist and it is developed, etch the p+ InP layer to form the coupling gratings. See FIG. 7d.

(6) Deposit a first oxide layer of average thickness 3 μm by decomposition of tetraethoxysilane (TEOS). Next, deposit a PSG layer of thickness 5 μm by decomposition of TEOS with phosphine. Then photolithographically define the location of the PSG core of the dielectric waveguide and its branches, and etch away the PSG outside of the core. The core has a width of 5 μm and thus a cross section which is substantially square. Deposit a second layer of oxide by TEOS decomposition, and photolithographically define the limits of the dielectric waveguide. Then etch the oxides and PSG to complete the dielectric waveguide. See FIG. 7e which shows the oxide covering the fingers of the coupling grating but not the distributed Bragg reflectors. Note that the oxide layers could be left on the distributed Bragg reflectors and replace the silicon nitride of the next step.

(7) Deposit a 0.3 μm thick layer of silicon nitride, and photolithographically define an openings for contact to the laser anodes. Then etch the nitride to form the contact openings to the anodes. Contacts to the n+ InP cathode are made by a via etched through the p type layers and lined with insulator. The via could be formed just prior to the nitride deposition and the etch for openings to the anodes could also form an opening to the cathode at the via bottom.

Alternatively, an n+ type substrate could be used, and backside contact made to the cathode contact.

Modifications and advantages

The preferred embodiments may be varied in many ways while retaining one or more of the features of a coupling grating integrated between a semiconductor waveguide and a dielectric waveguide.

For example, the materials could be changed such as an InP substrate in place of the silicon substrate and GaAs buffer layer. The structure could be planarized by recessing the area on the wafer where the laser and coupling grating are formed, thus the dielectric waveguide would not go over a step. Alternatively, planarization could be accomplished by a planarization etch after the deposition of the first oxide layer and then another oxide layer deposited for the separation of the coupling grating from the dielectric waveguide core. Other dielectrics such as silicon nitride could be used in place of oxide and PSG in the dielectric waveguide.

Figure 8:
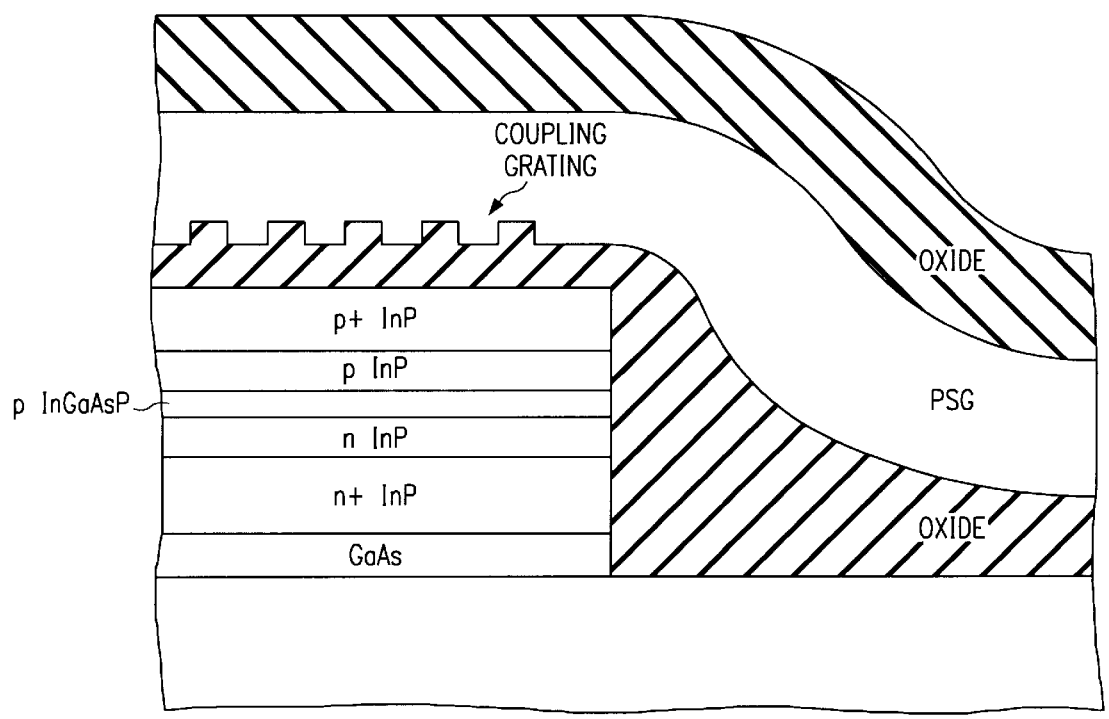
FIG. 8 illustrates an alternative coupling grating.

The coupling grating could be formed at the core-cladding interface of the dielectric waveguide. The evanescent wave from the InGaAsP core waveguide extends far enough into the oxide and PSG for such a grating to perform the necessary phase shift. But the grating may need to be fairly long, such as 300 µm. Forming this grating just amounts to doing the holographic lithography after the first oxide deposition rather than before it. FIG. 8 is analogous to FIG. 5b and shows such a grating.

The doping types could be changed as long as a diode exists for recombination. The active area could be undoped or made without quantum wells or of more involved quantum well structure.

What is claimed is:

1. A coupler between a semiconductor waveguide and a dielectric waveguide, comprising:

a grating between a rectangular semiconductor waveguide and a dielectric waveguide with a roughly square core, wherein said grating has a mechanical wave vector equal to the difference between a propagation vector of said semiconductor waveguide and a propagation vector of said dielectric waveguide.

2. The coupler of claim 1, wherein said semiconductor waveguide has a core having a rectangular cross section with a height to width ratio between 1 to 10 and 1 to 300.

3. The coupler of claim 2, wherein said semiconductor waveguide has a core having a rectangular cross section with a height to width ratio of about 1 to 12.5.

4. The coupler of claim 1, wherein said dielectric waveguide has a core of doped silicon dioxide.

5. The coupler of claim 4, wherein said doped silicon dioxide is phosphorous doped.

6. A coupler between a semiconductor waveguide and a dielectric waveguide, comprising:

(a) a grating between a rectangular semiconductor waveguide and a dielectric waveguide with a roughly square core, wherein said grating is formed as an integral portion of the interface between a cladding of said semiconductor waveguide and a cladding of said dielectric waveguide, wherein said dielectric waveguide is intrinsically aligned to said grating and said semiconductor waveguide, and said grating has a mechanical wave vector equal to the difference between a propagation vector of said semiconductor waveguide and a propagation vector of said dielectric waveguide.

7. The coupler of claim 6, wherein said semiconductor waveguide has a core having a rectangular cross section with a height to width ratio between 1 to 10 and 1 to 300.

8. The coupler of claim 7, wherein said semiconductor waveguide has a core having a rectangular cross section with a height to width ratio of about 1 to 12.5.

9. The coupler of claim 6, wherein said dielectric waveguide has a core of doped silicon dioxide.

10. The coupler of claim 9, wherein said doped silicon dioxide is phosphorous doped.

11. A coupler between a semiconductor waveguide and a dielectric waveguide, comprising:

(a) a grating between a rectangular semiconductor waveguide and a dielectric waveguide with a roughly square core, wherein said grating is formed as an integral portion of the interface between said core and cladding of said dielectric waveguide, wherein said dielectric waveguide is intrinsically aligned to said grating, and said grating has a mechanical wave vector equal to the difference between a propagation vector of said semiconductor waveguide and a propagation vector of said dielectric waveguide.

12. The coupler of claim 11, wherein said semiconductor waveguide has a core having a rectangular cross section with a height to width ratio between 1 to 10 and 1 to 300.

13. The coupler of claim 12, wherein said semiconductor waveguide has a core having a rectangular cross section with a height to width ratio of about 1 to 12.5.

14. The coupler of claim 11, wherein said dielectric waveguide has a core of doped silicon dioxide.

15. The coupler of claim 14, wherein said doped silicon dioxide is phosphorous doped.

* * * * *